United States Patent [19]

Chin

[11] 4,373,140
[45] Feb. 8, 1983

[54] PEAK DETECTOR

[75] Inventor: Sze L. Chin, Lake Ronkonkoma, N.Y.

[73] Assignee: Grumman Aerospace Corporation, Bethpage, N.Y.

[21] Appl. No.: 205,907

[22] Filed: Nov. 12, 1980

Related U.S. Application Data

[63] Continuation-in-part of Ser. No. 2,086, Jan. 9, 1979, abandoned.

[51] Int. Cl.³ .............................................. G01R 19/04
[52] U.S. Cl. ..................... 307/351; 307/359; 324/103 P; 328/151
[58] Field of Search ................. 307/350, 351, 359; 328/115, 151; 324/103 P

[56] References Cited

U.S. PATENT DOCUMENTS

| | | |
|---|---|---|
| 2,979,663 | 4/1961 | Gill et al. . |
| 3,002,154 | 9/1961 | Schmitz et al. . |
| 3,281,686 | 10/1966 | Cochran . |
| 3,295,060 | 12/1966 | Stern . |
| 3,346,742 | 10/1967 | Aniano et al. . |
| 3,375,501 | 3/1968 | McCutcheon et al. . |
| 3,448,291 | 6/1969 | Burk et al. . |
| 3,469,111 | 9/1969 | Peters et al. ..................... 307/351 |
| 3,694,748 | 9/1972 | Hekimian . |
| 3,846,692 | 11/1974 | Hill . |
| 3,882,489 | 5/1975 | Guggolz . |
| 3,979,670 | 9/1976 | Vahaviolos ..................... 307/351 |
| 4,121,121 | 10/1978 | Gabeler et al. ..................... 307/351 |

Primary Examiner—John Zazworsky
Attorney, Agent, or Firm—Morgan, Finnegan, Pine, Foley & Lee

[57] ABSTRACT

A peak detector circuit which provides a direct current output voltage proportional to the peak to peak amplitude of an input signal is disclosed. The peak detector is capable of operating with a variety of input signal waveforms. The utilization of an attenuator network and negative feedback techniques permit automatic and accurate operation over a wide dynamic range of input signal amplitudes. Frequency compensation of the attenuator network is provided to permit operation with input pulses having fast rise times and/or fast fall times. The inherent error due to diode forward conduction voltage is eliminated by the use of a DC restorer network which truly clamps the input signal to ground.

34 Claims, 2 Drawing Figures

PEAK DETECTOR

BACKGROUND OF THE INVENTION

This is a continuation-in-part of application Ser. No. 002,086, now abandoned filed on Jan. 9, 1979.

This invention relates to detector circuitry. More particularly, it relates to a peak detector circuit which provides a direct current (DC) output voltage that is proportional to the peak to peak amplitude of an input signal.

In many applications peak detector circuits are utilized in conjunction with automatic test equipment to provide an accurate reading of the amplitude of an input signal. Illustrative examples of such applications may be found in the aerospace industry. One such example pertains to automatic testing methods utilized to check the operation of sophisticated electronic systems found in modern aircraft. Illustrative of such electronic systems are the various high resolution radar systems such as, for example, ground mapping, weather avoidance and missile guidance found in many types of aircraft.

Typically, many radar systems utilize pulse techniques. Accordingly, it is desirable to be able to accurately measure various characteristics, including amplitude, of a pulse waveform.

One type of automatic test equipment which finds wide application in the avionics instrumentation field is an analyzer such as, for example, the Hewlett-Packard Series 9500, Automatic Test System. One of the many functions performed by this equipment is to provide an automatic reading of the amplitude of an input pulse signal. When utilized in this mode, the data measured by the analyzer is often acquired and processed by means of a peak detector circuit.

To avoid distorting the amplitude characteristics of the pulse waveform prior to its input to the analyzer, it is important that the peak detector utilized to acquire and process the input data be capable of operating over a wide dynamic range of input signal amplitudes and duty cycles.

It has been found, however, that many conventional peak detectors are not capable of operating over the wide dynamic range of input signal amplitudes and duty cycles experienced in practice. Similarly, it has been observed that the operational performance and accuracy of many conventional peak detectors tends to degrade over a period of time. Furthermore, many of the conventional circuits utilize a diode in the signal path to effect DC restoration. This further limits the accuracy obtainable as a result of the inherent error attributable to the forward conduction voltage of the diode.

Another drawback associated with many of the conventional peak detectors is the inability of the detector to respond to pulses having fast rise times and/or fast fall times. Similarly, many of the conventional peak detectors are limited to operation with pulse input signals.

It is accordingly an object of the invention to provide apparatus which provides a direct current output voltage proportional to the peak to peak amplitude of the input signal. More specifically, it is an object of the invention to overcome the aforementioned difficulties and drawbacks associated with conventional peak detector circuits.

It is a further object of the invention to provide peak detecting apparatus capable of accurately operating over a wide dynamic range of input signal amplitudes.

It is still another object of the invention to provide peak detecting apparatus capable of accurately operating with a variety of different input signal waveforms.

Other objects will be apparent in the following detailed description and the practice of the invention.

SUMMARY OF THE INVENTION

The foregoing and other objects and advantages which will be apparent in the following detailed description of the preferred embodiment, or in the practice of the invention, are achieved by the invention disclosed herein, which generally may be characterized as apparatus for providing a direct current output voltage proportional to the peak to peak amplitude of an input signal comprising: signal processing means adapted to receive said input signal; direct current restoring means operatively connected to said signal processing means; and peak detecting means responsive to said direct current restoring means.

BRIEF DESCRIPTION OF THE DRAWINGS

Serving to illustrate an exemplary embodiment of the invention are the drawings of which.

DESCRIPTION OF PREFERRED EMBODIMENT

In order to afford a complete understanding of the invention and an appreciation of its advantages, a description of a preferred embodiment is presented below.

Figure 1:
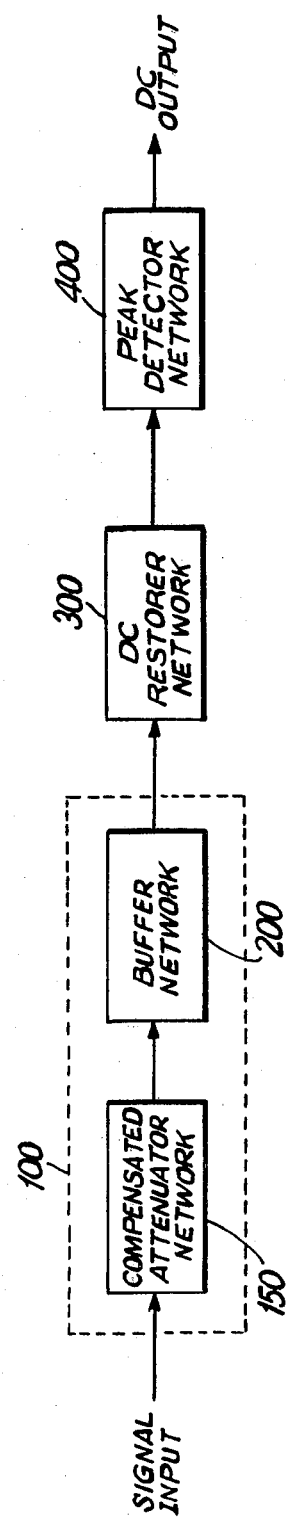
FIG. 1 illustrates a block diagram of a peak detector, in accordance with the present invention.

Referring to FIG. 1, a block diagram of a preferred embodiment of the peak detector, in accordance with the present invention, is illustrated. As shown therein, the peak detector consists of a number of functional subsystems comprising an input signal processing network 100, a direct current (DC) restorer network 300 and a peak detector network 400. Input signal processing network 100 includes a compensated attenuator network 150 and a buffer network 200. The compensated attenuator network 150 provides the proper attenuation for the input signal which is AC coupled to the DC restorer network 300 via the buffer network 200. After the signal is restored to a positive level, it is detected by the peak detector network 400 and translated into a DC output voltage which is proportional to the peak to peak amplitude of the input signal.

Figure 2:
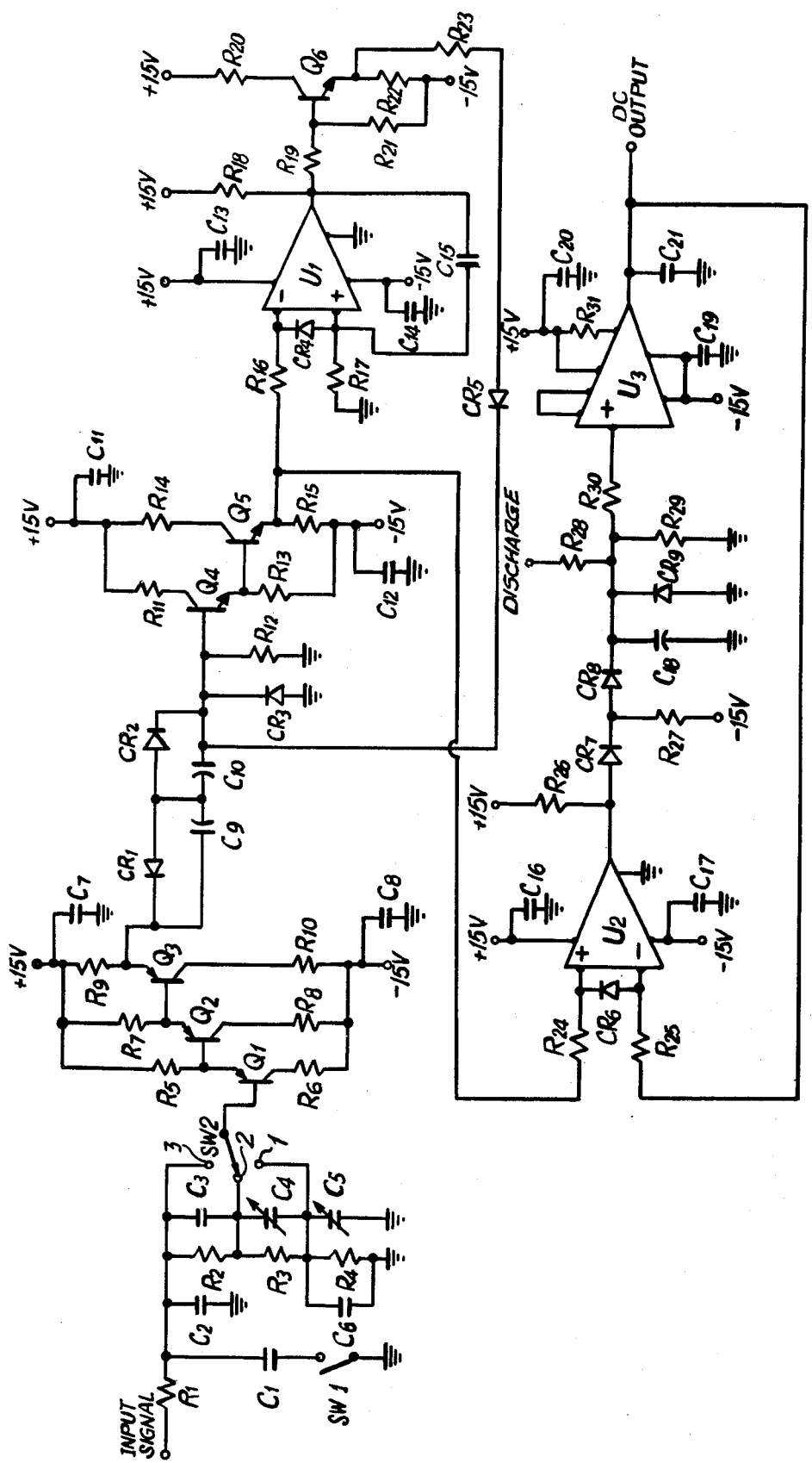
FIG. 2 illustrates a schematic diagram of the peak detector, in accordance with the present invention.

A schematic diagram of the preferred embodiment of the peak detector, in accordance with the present invention, is illustrated in FIG. 2. As shown therein, an input signal is applied to the peak detector through resistor $R_1$. When the input signal consists of a pulse, a conventional switch $SW_1$ is actuated to apply a filter network comprising resistor $R_1$ and capacitor $C_1$. The filter network is provided to smooth out any high frequency ringing on the pulse edges.

If the absolute amplitude of the input signal exceeds the maximum absolute dynamic range of the peak detector, the input signal amplitude must be attenuated accordingly. Signal attenuation is achieved through a potentiometric divider network comprising precision resistors $R_2$, $R_3$ and $R_4$. The signal attenuation, in increments of 5 to 1, 2 to 1 and 1 to 1, is selected by positions 1, 2 and 3, respectively, of a conventional switch $SW_2$.

Frequency compensation of the attenuator network is achieved through capacitors $C_2$, $C_3$, $C_4$, $C_5$ and $C_6$. Preferably, capacitors $C_4$ and $C_5$ are variable capacitors which may be adjusted to optimize the high frequency response to the attenuator network.

A buffer network, consisting of transistors $Q_1$, $Q_2$ and $Q_3$, provides a high input impedance to the attenuated input signal and a low output impedance to the DC restorer network. Biasing resistors $R_5$, $R_6$, $R_7$, $R_8$, $R_9$ and $R_{10}$ and bypass capacitors $C_7$ and $C_8$ are selected in accordance with conventional circuit design techniques.

The output of the buffer network is AC coupled through capacitors $C_9$ and $C_{10}$, in conjunction with diodes $CR_1$ and $CR_2$, to the DC restorer network. The values of $C_9$ and $C_{10}$ are selected to match the frequency characteristics of the input signal. Positive input signals are AC coupled to the DC restorer network via the series path comprising capacitor $C_9$ and diode $CR_2$ and negative input signals are AC coupled to the DC restorer network via the series path comprising diode $CR_1$ and capacitor $C_{10}$.

The DC restorer network, consisting of transistors $Q_4$, $Q_5$ and $Q_6$ and voltage comparator $U_1$, provides a positive DC level shift to the AC coupled input signal, i.e., the minimum amplitude of the input signal is clamped to signal ground and the maximum amplitude of the input signal is shifted positively to correspond to the peak to peak amplitude of the input signal.

A unique feature of the DC restorer network is that it truly clamps the input signal to ground eliminating the inherent error due to the forward conduction voltage $V_F$, of the clamping diode which is utilized in many conventional DC restoring circuits. The accuracy of the DC restorer network is further enhanced by a negative feedback loop explained in more detail below.

The AC coupled output of the buffer network is applied to the DC restorer network via transistors $Q_4$ and $Q_5$ which are each configured as emitter followers. Diode $CR_3$ limits the amplitude of the input voltage applied to the base of transistor $Q_4$. The output of the second emitter follower, $Q_5$, is applied to the inverting input terminal of voltage comparator $U_1$ via input resistor $R_{16}$. The non-inverting input terminal of voltage comparator $U_1$ is connected to ground via DC biasing resistor $R_{17}$. Diode $CR_4$ limits the amplitude of the input voltage applied to voltage comparator $U_1$. Biasing resistors $R_{11}$, $R_{12}$, $R_{13}$, $R_{14}$, $R_{15}$, $R_{18}$, $R_{19}$, $R_{20}$, $R_{21}$, and $R_{22}$ and bypass capacitors $C_{11}$, $C_{12}$, $C_{13}$ and $C_{14}$ are selected in accordance with conventional circuit design techniques. The value of capacitor $C_{15}$ is selected in accordance with the recommendations of the manufacturer of voltage comparator $U_1$.

When the voltage at the output of emitter follower $Q_5$ is positive with respect to ground, the output of voltage comparator $U_1$ is negative and transistor $Q_6$ is non-conductive. Diode $CR_5$ is also non-conductive and the feedback path between the output of transistor $Q_6$ and the input to transistor $Q_4$ is non-conductive. Similarly, when the voltage at the output of emitter follower $Q_5$ is negative with respect to ground, the output of voltage comparator $U_1$ is positive and transistor $Q_6$ is conductive. Diode $CR_5$ is also conductive and the series path comprising diode $CR_5$ and resistor $R_{23}$ provides a conductive feedback path between the output of transistor $Q_6$ and the input to transistor $Q_4$. The effect of the positive voltage fed back to the input to transistor $Q_4$ in conjunction with the negative input signal coupled to transistor $Q_4$ from the output of the buffer network causes the combined input signal to transistor $Q_4$ to become less negative with respect to ground. Diode $CR_5$ is conductive as long as the voltage at the output of emitter follower $Q_5$ remains negative with respect to ground. Ultimately diode $CR_5$ ceases to conduct and the feedback path between the output of transistor $Q_6$ and the input to transistor $Q_4$ becomes non-conductive. The point at which this occurs corresponds to the situation where the voltage at the output of emitter follower $Q_5$ is clamped to ground, i.e., the minimum amplitude of the input signal is 0 volts DC. At this point the voltage at the output of emitter follower $Q_5$ is a positive DC restored signal.

The positive DC restored signal appearing at the emitter of transistor $Q_5$ is directly coupled to the peak detector network consisting of voltage comparator $U_2$, diodes $CR_7$, $CR_8$ and $CR_9$, and buffer amplifier $U_3$. The peak detector network detects the peak amplitude of the DC restored signal and provides a DC output voltage equal to that amplitude.

The positive DC restored signal appearing at the emitter of transistor $Q_5$ is applied through resistor $R_{24}$ to the non-inverting input terminal of voltage comparator $U_2$. The amplitude of the input voltage applied to comparator $U_2$ is limited by diode $CR_6$. The inverting input terminal of comparator $U_2$ is connected to the output of the peak detector network through a feedback path comprising resistor $R_{25}$. Biasing resistors $R_{26}$, $R_{27}$ and $R_{31}$ and bypass capacitors $C_{16}$, $C_{17}$, $C_{19}$, and $C_{20}$ are selected in accordance with conventional circuit design techniques. Capacitor $C_{21}$ is selected to smooth out any high frequency ringing on the DC output signal. Diode $CR_9$ limits the amplitude of the input voltage applied to buffer amplifier $U_3$.

As the amplitude of the DC restored signal appearing at the non-inverting input of voltage comparator $U_2$ increases, the output of $U_2$ increases causing diodes $CR_7$ and $CR_8$ to conduct. This results in storage capacitor $C_{18}$ being charged to a positive level. The positive signal at the output of comparator $U_2$ is coupled to buffer amplifier $U_3$ via limiting resistor $R_{30}$. As illustrated, buffer amplifier $U_3$ is configured to provide a gain of unity. Accordingly, the voltage level appearing at the output of buffer amplifier $U_3$ equals the voltage level on capacitor $C_{18}$. The output of buffer amplifier $U_3$ is fed back to the inverting input terminal of voltage comparator $U_2$ via resistor $R_{25}$. It is apparent that the use of negative feedback ensures that capacitor $C_{18}$ is charged to a voltage level equal to the peak amplitude of the DC restored signal.

The effect of the voltage fed back to the inverting input of voltage comparator $U_2$ causes the DC output voltage to approach eventually the peak amplitude of the DC restored signal, which is applied to the non-inverting input of $U_2$. During the presence of the DC restored signal within each signal period its peak amplitude is compared with the fed back voltage. If the DC output voltage is lower than the peak amplitude of the DC restored signal, the output of comparator $U_2$ will increase causing capacitor $C_{18}$ to be charged to a higher voltage level. This in turn results in the DC output voltage increasing accordingly. During the absence of the DC restored signal within the signal period, the output of comparator $U_2$ will decrease because the fed back voltage is now greater than that at the non-inverting input of $U_2$. As a result, Diode $CR_8$ is back biased and becomes non-conductive. Consequently capacitor C18 begins to discharge mainly through resistor $R_{29}$ until the reoccurrence of the DC restored signal, at which time capacitor C18 begins to be charged again. As long as the amount of charge gained by capacitor C18 during the charging period is greater than the amount lost during the discharging period, the peak detector network is effective; and hence the DC output will eventually approach the peak amplitude of the DC restored signal.

The accuracy of the peak detector depends on the duty cycle and frequency of the input signal, i.e., a higher duty cycle and frequency would result in better accuracy. Resistor $R_{28}$ in conjunction with the Discharge terminal provides a path for the capacitor C18 to discharge quickly by external means, such as momentarily grounding the Discharge terminal.

Exemplary values for the various components embodied in the circuit of FIG. 2 are as follows. Unless otherwise specified, resistor wattages are ¼ watts.

$R_1$: 20 ohms (½ watt)
$R_2$: 135 Kohms (0.1%)
$R_3$: 80.6 Kohms (0.1%)
$R_4$: 54.2 Kohms (0.1%)
$R_5$: 100 Kohms
$R_6$: 10 Kohms
$R_7$: 22 Kohms
$R_8$: 2.2 Kohms
$R_9$: 1 Kohm
$R_{10}$: 220 ohms
$R_{11}$: 2.2 Kohms
$R_{12}$: 300 Kohms
$R_{13}$: 33 Kohms
$R_{14}$: 270 ohms
$R_{15}$: 1.5 Kohms
$R_{16}$: 1 Kohm
$R_{17}$: 1 Kohm $R_{18}$: 1 Kohm
$R_{19}$: 100 ohms
$R_{20}$: 100 ohms
$R_{21}$: 33 Kohms
$R_{22}$: 1.5 Kohms
$R_{23}$: 100 ohms
$R_{24}$: 1 Kohm
$R_{25}$: 1 Kohm
$R_{26}$: 1 Kohm
$R_{27}$: 22 Kohms
$R_{28}$: 1 Kohm
$R_{29}$: 6.2 Mohms
$R_{30}$: 100 ohms
$R_{31}$: 150 ohms
$C_1$: 2200 picofarads
$C_2$: 120 picofarads
$C_3$: 39 picofarads
$C_4$: 9–35 picofarads
$C_5$: 9–35 picofarads
$C_6$: 50 picofarads
$C_7$: 0.01 microfarads
$C_8$: 0.01 microfarads
$C_9$: 10 microfarads
$C_{10}$: 10 microfarads
$C_{11}$: 0.01 microfarads
$C_{12}$: 0.01 microfarads
$C_{13}$: 0.01 microfarads
$C_{14}$: 0.01 microfarads
$C_{15}$: 850 picofarads
$C_{16}$: 0.01 microfarads
$C_{17}$: 0.01 microfarads
$C_{18}$: 1.5 microfarads
$C_{19}$: 0.01 microfarads
$C_{20}$: 0.01 microfarads
$C_{21}$: 1000 picofarads
$CR_1$: IN 4148
$CR_2$: IN 4148
$CR_3$: IN 4148
$CR_4$: IN 4148
$CR_5$: IN 4148
$CR_6$: IN 4148
$CR_7$: IN 4148
$CR_8$: IN 4148
$CR_9$: IN 4148
$Q_1$: 2N 2907A
$Q_2$: 2N 2907A
$Q_3$: 2N 2907A
$Q_4$: 2N 2222A
$Q_5$: 2N 2222A
$Q_6$: 2N 2222A
$U_1$: LM 106
$U_2$: LM 106
$U_3$: LH 0033

Although the above description is primarily in terms of an input signal comprising a pulse waveform, the operation of the peak detector of the present invention works equally as well with any type of input signal waveform.

It is clear that the above description of the preferred embodiment in no way limits the scope of the present invention which is defined by the following claims.

What is claimed is:

1. Apparatus for providing a direct current output voltage proportional to the peak to peak amplitude of an input signal comprising:
    (a) signal processing means adapted to receive said input signal;
    (b) direct current restoring means operatively connected to said signal processing means;
    (c) peak detecting means responsive to said direct current restoring means; and
    (d) first feedback means connected between the output of said direct current restoring means and the input to said direct current restoring means.

2. Apparatus as recited in claim 1 further comprising second feedback means connected between the output of said peak detecting means and the input to said peak detecting means.

3. Apparatus as recited in claim 2 wherein said signal processing means includes buffering means operatively connected to said direct current restoring means.

4. Apparatus as recited in claim 3 wherein said signal processing means further includes filtering means connected to the input to said buffering means.

5. Apparatus as recited in claim 4 wherein said signal processing means further includes attenuating means connected between said filtering means and said buffering means.

6. Apparatus as recited in claim 5 wherein said peak detecting means includes energy storage means.

7. Apparatus as recited in claim 6 wherein said peak detecting means further includes means for discharging said energy storage means.

8. Apparatus as recited in claim 7 wherein said signal processing means includes frequency compensation means associated with said attenuating means.

9. Apparatus as recited in claim 8 wherein said first feedback means comprises a resistor connected in series with a diode, said resistor connected to the output of said direct current restoring means and the cathode of said diode connected to the input to said direct current restoring means.

10. Apparatus as recited in claim 9 wherein said peak detecting means includes an input network having a non-inverting input terminal and an inverting input terminal.

11. Apparatus as recited in claim 10 wherein said second feedback means comprises a resistor connected between the output of said peak detecting means and the inverting input terminal of said peak detecting means.

12. Apparatus as recited in claim 11 wherein said energy storage means comprises a capacitor and said discharging means comprises a resistor.

13. Apparatus for providing a direct current output voltage proportional to the peak to peak amplitude of an input signal comprising:
 (a) signal processing means adapted to receive said input signal, said signal processing means including buffering means;
 (b) direct current restoring means operatively connected to said buffering means, said direct current restoring means including first feedback means connected between the output of said direct current restoring means and the input to said direct current restoring means; and
 (c) peak detecting means responsive to said direct current restoring means, said peak detecting means including second feedback means connected between the output of said peak detecting means and the input to said peak detecting means.

14. Apparatus as recited in claim 13 wherein said signal processing means includes filtering means connected to the input to said buffering means.

15. Apparatus as recited in claim 14 wherein said signal processing means further includes attenuating means connected between said filtering means and said buffering means.

16. Apparatus as recited in claim 15 wherein said peak detecting means includes energy storage means.

17. Apparatus as recited in claim 16 wherein said peak detecting means further includes means for discharging said energy storage means.

18. Apparatus as recited in claim 17 wherein said signal processing means includes frequency compensation means associated with said attenuating means.

19. Apparatus as recited in claim 18 wherein said first feedback means comprises a resistor connected in series with a diode, said resistor connected to the output of said direct current restoring means and the cathode of said diode connected to the input to said direct current restoring means.

20. Apparatus as recited in claim 19 wherein said peak detecting means includes an input network having a non-inverting input terminal and an inverting input terminal.

21. Apparatus as recited in claim 20 wherein said second feedback means comprises a resistor connected between the output of said peak detecting means and the inverting input terminal of said peak detecting means.

22. Apparatus as recited in claim 21 wherein said energy storage means comprises a capacitor and said discharging means comprises a resistor.

23. Apparatus for providing a direct current output voltage proportional to the peak to peak amplitude of an input signal comprising:
 (a) a signal processing network adapted to receive said input signal, said signal processing network including an input filter network, an attenuator network and a buffer network, said attenuator network connected between the output of said filter network and the input to said buffer network;
 (b) a direct current restorer network operatively connected to the output of said buffer network, the output of said direct current restorer network connected to the input to said direct current restorer network via a first feedback path; and
 (c) a peak detector network operatively connected to said direct current restorer network, said peak detector network including an input amplifier having a non-inverting input terminal connected to said direct current restorer network and an inverting input terminal connected to the output of said peak detector network via a second feedback path.

24. Apparatus as recited in claim 23 wherein said signal processing network includes a frequency compensation network associated with said attenuator network.

25. Apparatus as recited in claim 24 further including means for alternating current coupling the output of said buffer network to the input to said direct current restoring network.

26. Apparatus as recited in claim 25 wherein said first feedback path comprises a resistor connected in series with a diode, said resistor connected to the output of said direct current restorer network and the cathode of said diode connected to the input to said direct current restorer network.

27. Apparatus as recited in claim 26 wherein said second feedback path comprises a resistor.

28. Apparatus as recited in claim 27 wherein said peak detector network includes a storage capacitor.

29. Apparatus as recited in claim 28 wherein said peak detector network further includes a resistor for providing a discharge path for said storage capacitor.

30. Apparatus as recited in claim 29 wherein said signal processing network includes means for controllably connecting said filter network to said signal processing network.

31. Apparatus as recited in claim 30 wherein said signal processing network further includes means for controllably varying the amount of attenuation provided by said attenuator network.

32. Apparatus as recited in claim 31 wherein said connecting means comprises a first switch associated with said filter network.

33. Apparatus as recited in claim 32 wherein said varying means comprises a second switch associated with said attenuator network.

34. Apparatus as recited in claim 33 wherein said alternating current coupling means includes a first series path comprising a first diode and a first capacitor, the negative electrode of said first capacitor connected to the anode of said first diode, and a second series path comprising a second capacitor and a second diode, the anode of said second diode connected to the negative electrode of said second capacitor.

* * * * *

UNITED STATES PATENT AND TRADEMARK OFFICE
CERTIFICATE OF CORRECTION

PATENT NO. : 4,373,140
DATED : February 8, 1983
INVENTOR(S) : Sze L. Chin

It is certified that error appears in the above—identified patent and that said Letters Patent is hereby corrected as shown below:

In Col. 4, line 61 and Col. 5, lines 1, 3, 5 and 14, "C18" should read -- $C_{18}$ --; in Col. 4, line 67, "CR8" should read -- $CR_8$ --.

In Col. 5, lines 21-27, 30-32, 34, 39-40 and 45, "Kohms" should read -- K ohms --; on lines 28, 35-36, 42-44 and 46, "Kohm" should read -- K ohm --; also on line 36, "$R_{18}$: 1 K ohm" should be moved down to the next line; and on line 47, "Mohms" should read -- M ohms --.

Signed and Sealed this

Twenty-eighth Day of June 1983

[SEAL]

Attest:

GERALD J. MOSSINGHOFF

Attesting Officer        Commissioner of Patents and Trademarks